US012587162B2

(12) United States Patent
Iwamoto

(10) Patent No.: US 12,587,162 B2
(45) Date of Patent: Mar. 24, 2026

(54) ACOUSTIC WAVE DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 933 days.

(21) Appl. No.: 17/731,547

(22) Filed: Apr. 28, 2022

(65) Prior Publication Data

US 2022/0255527 A1 Aug. 11, 2022

Related U.S. Application Data

(63) Continuation of application No. PCT/JP2020/041292, filed on Nov. 5, 2020.

(30) Foreign Application Priority Data

Nov. 6, 2019 (JP) ................................. 2019-201522
Nov. 6, 2019 (JP) ................................. 2019-201524

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/02866* (2013.01); *H03H 9/25* (2013.01)

(58) Field of Classification Search
CPC .......... H03H 9/02574; H03H 9/02559; H03H 9/02866; H03H 9/25

USPC ...... 310/313 R, 313 A, 313 B, 313 C, 313 D
See application file for complete search history.

(56) References Cited

U.S. PATENT DOCUMENTS

2007/0090898 A1* 4/2007 Kando ............... H03H 9/14538
                                                    333/195
2008/0169474 A1* 7/2008 Sheppard ............... H10N 39/00
                                                    257/E27.014
2012/0194032 A1 8/2012 Kadota
2013/0112011 A1 5/2013 Kawai
2013/0285768 A1 10/2013 Watanabe et al.
2014/0225684 A1* 8/2014 Kando ............... H03H 9/14594
                                                    333/195

(Continued)

FOREIGN PATENT DOCUMENTS

JP        08-310900 A    11/1996
JP        2013101018 A    5/2013

(Continued)

OTHER PUBLICATIONS

Official Communication issued in International Patent Application No. PCT/JP2020/041292, mailed on Dec. 8, 2020.

(Continued)

*Primary Examiner* — Derek J Rosenau
(74) *Attorney, Agent, or Firm* — Keating & Bennett, LLP

(57) ABSTRACT

An acoustic wave device includes a support substrate, a piezoelectric layer on the support substrate, and an IDT electrode on the piezoelectric layer and including a plurality of electrode fingers. The support substrate is a silicon carbide substrate including a 3C-SiC cubic crystal structure. The piezoelectric layer is a lithium tantalate layer or a lithium niobate layer. An SH wave is used as a main mode.

17 Claims, 12 Drawing Sheets

(56) References Cited

U.S. PATENT DOCUMENTS

2018/0205361 A1*   7/2018  Kishimoto ............. H03H 9/175
2019/0199320 A1    6/2019  Morita et al.

FOREIGN PATENT DOCUMENTS

| JP | 2019-114986 A | 7/2019 |
|----|---------------|--------|
| JP | 2019-146143 A | 8/2019 |
| WO | 2011/046117 A1 | 4/2011 |
| WO | 2012/086639 A1 | 6/2012 |
| WO | 2013/061926 A1 | 5/2013 |

OTHER PUBLICATIONS

Official Communication issued in corresponding Chinese Patent Application No. 202080076647.6, issued on Jan. 15, 2026, 9 pages.

* cited by examiner (110) PLANE

ACOUSTIC WAVE DEVICE

CROSS REFERENCE TO RELATED APPLICATIONS

This application claims the benefit of priority to Japanese Patent Application No. 2019-201524 filed on Nov. 6, 2019 and Japanese Patent Application No. 2019-201522 filed on Nov. 6, 2019, and is a Continuation Application of PCT Application No. PCT/JP2020/041292 filed on Nov. 5, 2020. The entire contents of each application are hereby incorporated herein by reference.

BACKGROUND OF THE INVENTION

1. Field of the Invention

The present invention relates to an acoustic wave device.

2. Description of the Related Art

Conventionally, acoustic wave devices have been widely used in, for example, filters of mobile phones. International Publication No. WO 2012/086639 described below discloses an example acoustic wave device. This acoustic wave device includes a piezoelectric film on a support substrate and an IDT (interdigital transducer) on the piezoelectric film. The support substrate is made of, for example, silicon or silicon carbide. The piezoelectric film is made of, for example, lithium tantalate or lithium niobate.

SUMMARY OF THE INVENTION

However, the studies carried out by the inventors of preferred embodiments of the present invention have discovered that a large spurious response may be generated by a higher-order mode depending on, for example, the form of crystal, such as silicon carbide, used in a support substrate in an acoustic wave device as described above.

Preferred embodiments of the present invention are directed to acoustic wave devices each including a silicon carbide substrate as a support substrate and reducing or preventing a higher-order mode.

An acoustic wave device according to a preferred embodiment of the present invention includes a support substrate, a piezoelectric layer on the support substrate, and an IDT electrode on the piezoelectric layer and including a plurality of electrode fingers. The support substrate is a silicon carbide substrate including a 3C—SiC cubic crystal structure. The piezoelectric layer is a lithium tantalate layer or a lithium niobate layer. An SH wave is used as a main mode.

Preferred embodiments of the present invention provide acoustic wave devices that each include a silicon carbide substrate as a support substrate and can reduce or prevent a higher-order mode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

It should be understood that the preferred embodiments in this description are illustrative only, and partial replacements or combinations of configurations can be made between different preferred embodiments.

Figure 1:
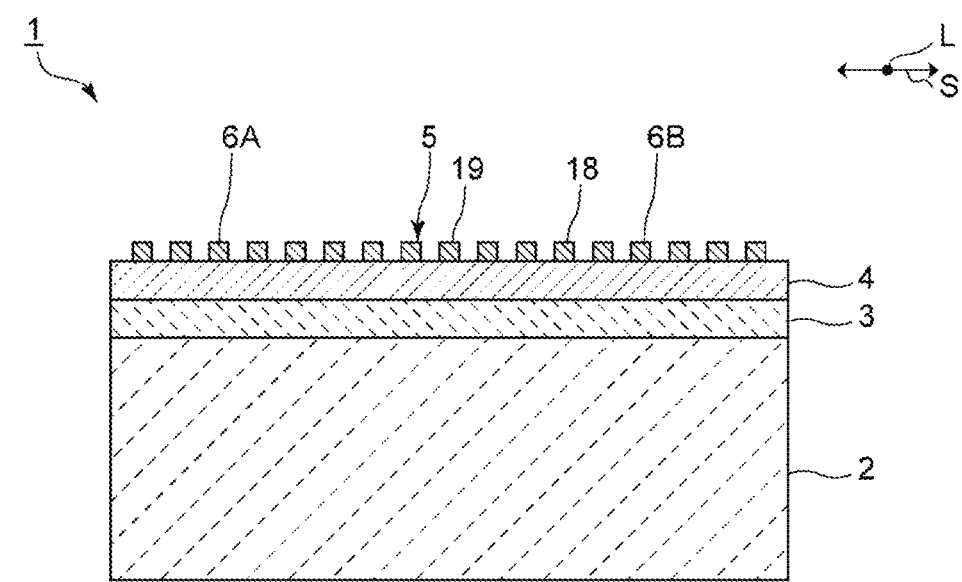
FIG. 1 is a front sectional view of an acoustic wave device according to a first preferred embodiment of the present invention.

FIG. 1 is a front sectional view of an acoustic wave device according to a first preferred embodiment of the present invention.

An acoustic wave device 1 has a support substrate. The support substrate in this preferred embodiment is a silicon carbide substrate 2. More specifically, the crystal structure of the silicon carbide substrate 2 is a 3C—SiC cubic crystal structure.

A low acoustic velocity film 3 is provided on the silicon carbide substrate 2. A piezoelectric layer is provided on the low acoustic velocity film 3. The piezoelectric layer in this preferred embodiment is a lithium tantalate layer 4. The piezoelectric layer may be a lithium niobate layer.

An IDT electrode 5 is provided on the lithium tantalate layer 4. Application of an AC voltage to the IDT electrode 5 excites acoustic waves in various modes. The acoustic wave device 1 uses an SH wave as a main mode.

In this preferred embodiment, the acoustic velocity of a slow transversal wave of bulk waves propagating in the silicon carbide substrate 2 is higher than the acoustic velocity of an SH wave propagating in the piezoelectric layer. More specifically, the acoustic velocity of a slow transversal wave of bulk waves propagating in the silicon carbide substrate 2 is higher than the acoustic velocity of an SH wave propagating in the piezoelectric layer at an anti-resonant frequency. In this case, $V_{Low} > V_{SHa}$ is satisfied, where $V_{Low}$ is the acoustic velocity of a slow transversal wave of bulk waves propagating in the silicon carbide substrate 2, $V_{SH}$ is the acoustic velocity of an SH wave propagating in the piezoelectric layer, and $V_{SHa}$ is the acoustic velocity of an SH wave propagating in the piezoelectric layer at an anti-resonant frequency. It is noted that the relationship of $V_{Low} > V_{SHa}$ is not necessarily satisfied. At a frequency other than the anti-resonant frequency, the relationship of $V_{Low} > V_{SH}$ may be established.

A pair of a reflector 6A and a reflector 6B is located on both sides of the IDT electrode 5 on the lithium tantalate layer 4 in the acoustic wave propagation direction. The acoustic wave device 1 of this preferred embodiment is an acoustic wave resonator. The acoustic wave devices according to preferred embodiments of the present invention are not limited to an acoustic wave resonator and may be, for example, a filter device including multiple acoustic wave resonators.

Figure 2:
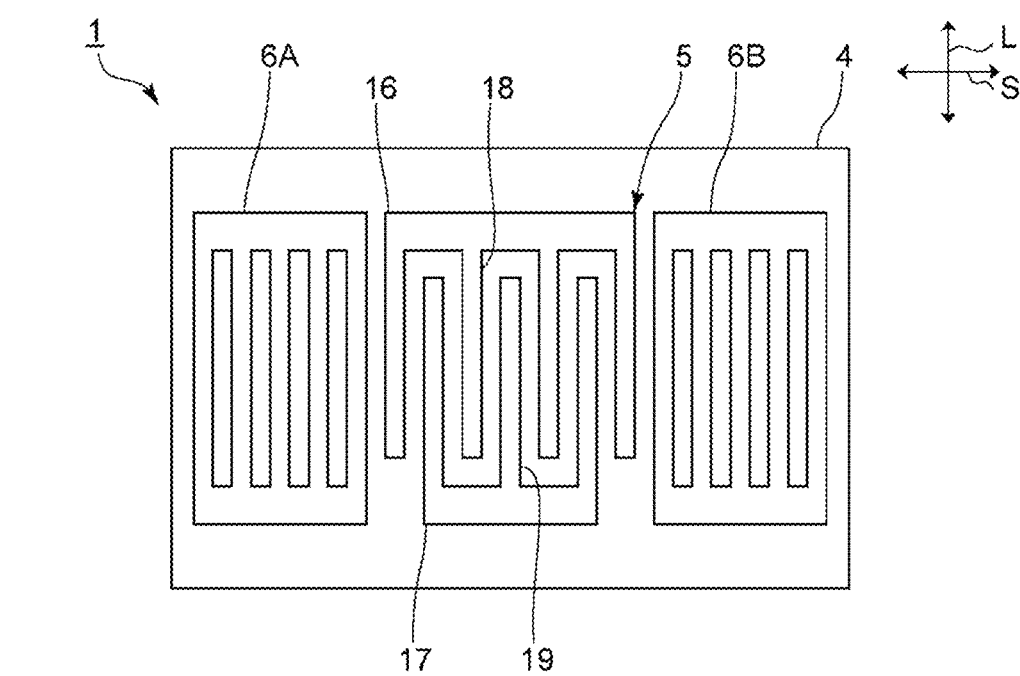
FIG. 2 is a plan view of an acoustic wave device according to a first preferred embodiment of the present invention.

FIG. 2 is a plan view of an acoustic wave device according to a first preferred embodiment.

The IDT electrode 5 includes a first busbar 16 and a second busbar 17. The first busbar 16 and the second busbar 17 face each other. The IDT electrode 5 has multiple first electrode fingers 18 each having an end connected to the first busbar 16. The IDT electrode 5 further includes multiple second electrode fingers 19 each including an end connected to the second busbar 17. The first electrode fingers 18 and the second electrode fingers 19 are interdigitated with each other. The propagation direction of surface acoustic waves is defined as an S direction, and the direction perpendicular to the S direction is defined as an L direction. The L direction is a direction in which the first electrode fingers 18 and the second electrode fingers 19 extend.

The IDT electrode 5 is a single-layer Al film. The material of the reflector 6A and the reflector 6B is the same as the material of the IDT electrode 5. The material of the IDT electrode 5, the reflector 6A, and the reflector 6B is not limited to the material described above. Alternatively, the IDT electrode 5, the reflector 6A, and the reflector 6B may each be a multilayer metal film including multiple metal layers stacked on top of each other.

The low-acoustic-velocity film 3 shown in FIG. 1 is a relatively low acoustic velocity film. More specifically, the acoustic velocity of bulk waves propagating in the low acoustic velocity film 3 is lower than the acoustic velocity of bulk waves propagating in the lithium tantalate layer 4 defining and functioning as a piezoelectric layer. The low acoustic velocity film 3 in this preferred embodiment is a silicon oxide film. Silicon oxide is represented by $SiO_x$. x is an arbitrary positive number. Silicon oxide of the low acoustic velocity film 3 in this preferred embodiment is $SiO_2$. The material of the low acoustic velocity film 3 is not limited to the above material and may be, for example, glass, silicon oxynitride, tantalum oxide, or a material containing, as a main component, a compound produced by adding fluorine, carbon, or boron to silicon oxide.

In the acoustic wave device 1, the lithium tantalate layer 4 is indirectly stacked on the silicon carbide substrate 2 with the low acoustic velocity film 3 therebetween. The lithium tantalate layer 4 may be directly stacked on the silicon carbide substrate 2.

The silicon carbide substrate 2 in this preferred embodiment will be specifically described below.

Figure 3:
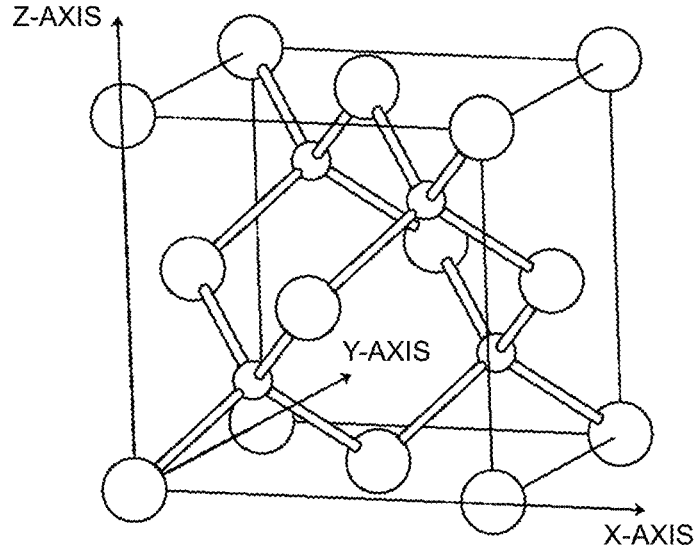
FIG. 3 is a schematic view illustrating the definition of the crystal axes of silicon carbide.
Figure 4:
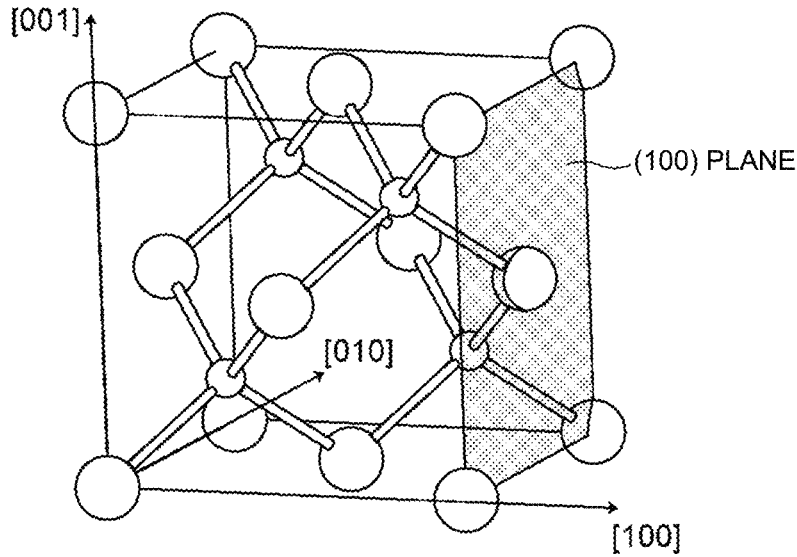
FIG. 4 is a schematic view illustrating the (100) plane of silicon carbide.
Figure 5:
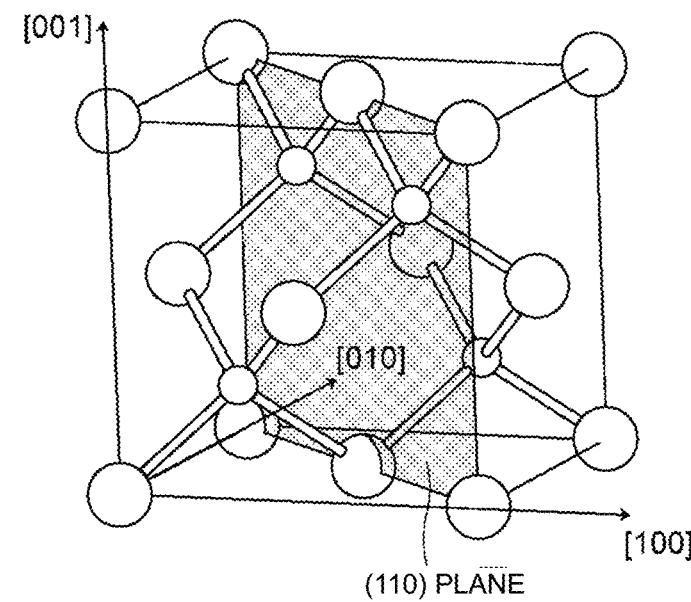
FIG. 5 is a schematic view illustrating the (110) plane of silicon carbide.

FIG. 3 is a schematic view illustrating the definition of the crystal axes of silicon carbide. FIG. 4 is a schematic view illustrating the (100) plane of silicon carbide. FIG. 5 is a schematic view illustrating the (110) plane of silicon carbide.

Referring to FIG. 3, the silicon carbide substrate 2 is a silicon carbide single crystal substrate having a 3C—SiC cubic crystal structure. In this description, the crystal axes of silicon carbide of the silicon carbide substrate 2 are denoted by (X, Y, Z). In silicon carbide, the X-axis, the Y-axis, and the Z-axis are equivalent due to the symmetry of the crystal structure.

The plane orientation of the silicon carbide substrate 2 in the acoustic wave device 1 is, for example, (100). The plane orientation of (100) indicates a substrate cut along the (100) plane perpendicular to the crystal axis represented by the Miller index [100] in the crystal structure. The (100) plane is a plane shown in FIG. 4. The (100) plane also includes other crystallographically equivalent planes. The main surface of the silicon carbide substrate 2 is not limited to the (100) plane and may be, for example, a (110) plane shown in FIG. 5. The Euler angles of the silicon carbide substrate

2 are denoted by ($\theta_{SiC}$, $\theta_{SiC}$, $\psi_{SiC}$). When the planes of the silicon carbide substrate 2 are expressed by using the Euler angles, the (100) plane is represented by (90°, 90°, $\psi_{SiC}$), and the (110) plane is represented by (−45°, −90°, 90°). The plane orientation or the Euler angles of the silicon carbide substrate 2 are not limited to these. In this description, unless otherwise specified, the X-axis direction is the same as the [100] direction, the Y-axis direction is the same as the [010] direction, and the Z-axis direction is the same as the [001] direction.

Unique features of this preferred embodiment include the lithium tantalate layer 4 and the silicon carbide substrate 2 including a 3C—SiC cubic crystal structure being stacked on top of each other, and the acoustic wave device 1 using an SH mode. This configuration reduces or prevents the higher-order mode in the acoustic wave device 1 including the silicon carbide substrate 2. The details will be described below.

The acoustic wave device 1 having the configuration of the first preferred embodiment and the satisfying design parameters was prepared. The wavelength defined by the electrode finger pitch of the IDT electrode 5 is denoted by λ. The electrode finger pitch refers to an average value of electrode finger center-to-center distances between adjacent electrode fingers in the IDT electrode 5.

Silicon carbide substrate 2; material . . . SiC with 3C—SiC cubic crystal structure, plane orientation . . . (100), thickness . . . 1 μm Low acoustic velocity film 3; material . . . SiO₂, thickness . . . 0.1λ

Lithium tantalate layer 4; material . . . 35° Y—LiTaO₃, thickness . . . 0.15λ

IDT electrode 5; material . . . Al, thickness . . . 0.05λ

In Comparative Example 1, an acoustic wave device including a silicon carbide substrate made of silicon carbide with a 4H—SiC hexagonal structure was prepared. The design parameters of Comparative Example 1 were the same as those of the acoustic wave device 1 except for the silicon carbide substrate. The intensity of the higher-order mode was compared between the acoustic wave device 1 having the configuration of the first preferred embodiment and the acoustic wave device of Comparative Example 1.

Figure 6:
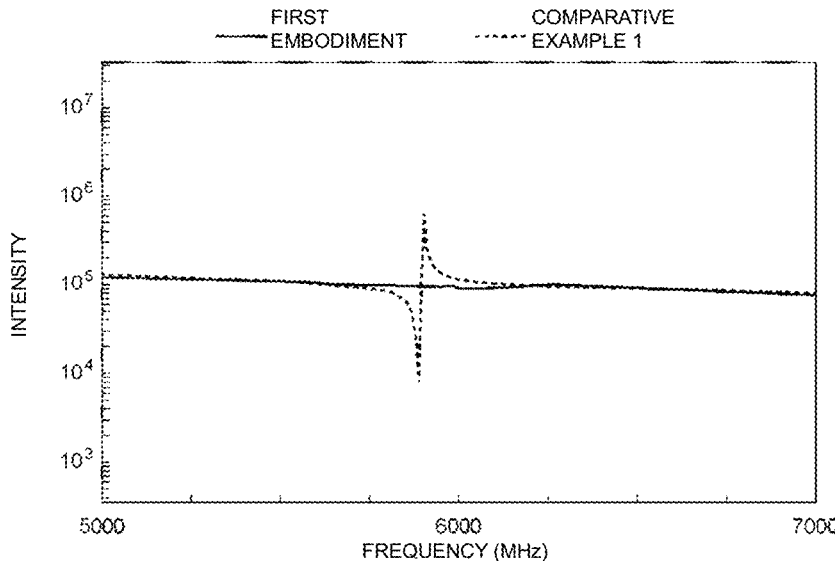
FIG. 6 is a figure illustrating the intensities of higher-order modes in the first preferred embodiment and Comparative Example 1 of the present invention.

FIG. 6 is a figure illustrating the intensities of higher-order modes in the first preferred embodiment and Comparative Example 1.

As shown in FIG. 6, a large higher-order mode is generated at about 6000 MHz in Comparative Example 1. FIG. 6 indicates that the intensity of the higher-order mode in the first preferred embodiment is much lower than that of the higher-order mode in Comparative Example 1. In the first preferred embodiment, the higher-order mode can thus be reduced or prevented.

As in the first preferred embodiment, the acoustic velocity of the higher-order mode propagating in the piezoelectric layer is preferably higher than the acoustic velocity of a slow transversal wave of bulk waves propagating in the silicon carbide substrate 2. This causes the higher-order mode to leak to the silicon carbide substrate 2 and can more assuredly reduce or prevent the higher-order mode.

The electromechanical coupling coefficient of each mode excited in the acoustic wave device 1 depends on the cut-angle of lithium tantalate used in the lithium tantalate layer 4. The range of the cut-angle suitable for using an SH wave as a main mode will be described below.

Figure 7:
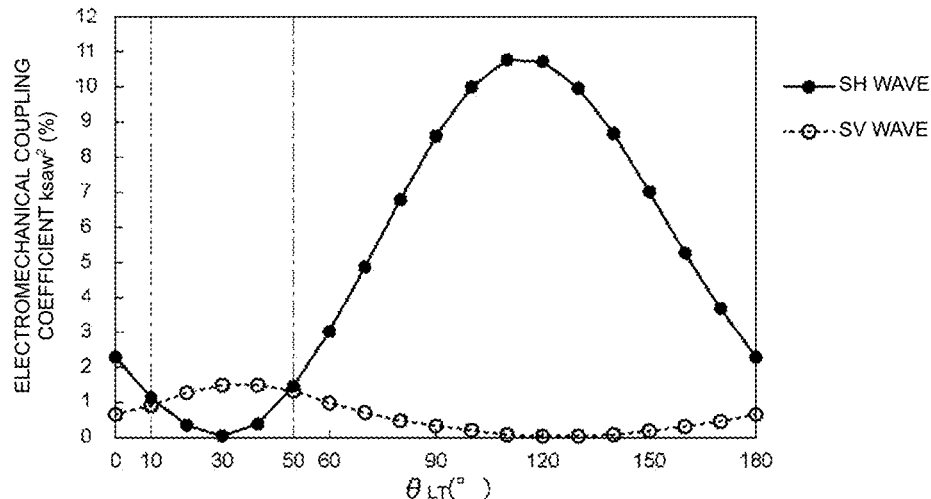
FIG. 7 is a figure illustrating the relationship between the cut-angle of a lithium tantalate layer and the electromechanical coupling coefficients of an SH wave and an SV wave.

FIG. 7 is a figure illustrating the relationship between the cut-angle of the lithium tantalate layer and the electromechanical coupling coefficient of the SH wave and the SV wave.

In the acoustic wave device 1, the SV wave is excited in addition to the SH wave. FIG. 7 indicates that the electromechanical coupling coefficient of the SH wave is larger than the electromechanical coupling coefficient of the SV wave when the cut-angle of the lithium tantalate layer is about 0° or more and about 10° or less and when it is about 500 or more and about 1800 or less. In the above range of the cut-angle, the excitation intensity of the SH wave is higher than that of the SV wave using another mode. Thus, the cut-angle of the lithium tantalate layer is preferably about 0° or more and about 10° or less and preferably about 50° or more and about 1800 or less. In this case, the SH wave can be preferably used as a main mode.

The IDT electrode 5 preferably has a thickness of about 0.07λ or less. This configuration can increase the Q value. The reason for this will be described below.

The acoustic wave devices 1 having the configuration of the first preferred embodiment and the following design parameters and different in the thickness of the IDT electrode 5 were prepared.

Silicon carbide substrate 2; material . . . SiC with 3C—SiC cubic crystal structure, plane orientation . . . (100)

Low acoustic velocity film 3; material . . . SiO₂, thickness . . . 0.1λ

Lithium tantalate layer 4; material . . . 35° Y—LiTaO₃, thickness . . . 0.15λ

IDT electrode; material . . . Al, thickness . . . varied between 0.01λ or more and 0.15λ or less FIG. 8 is a figure illustrating the relationship between the thickness of the IDT electrode and the Q value.

Figure 8:
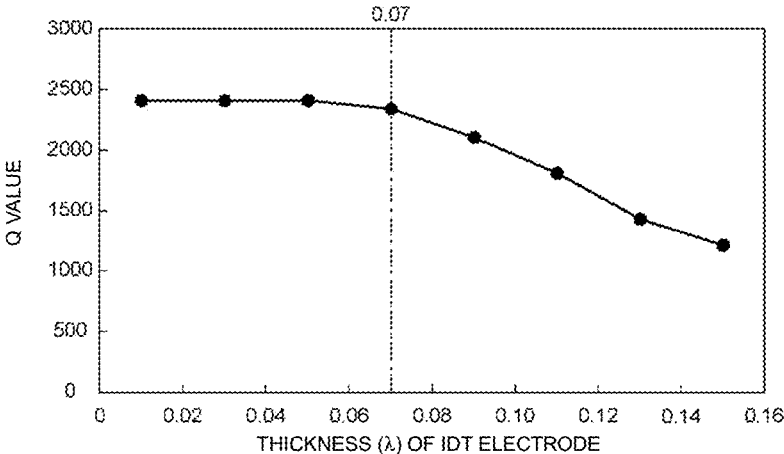
FIG. 8 is a figure illustrating the relationship between the thickness of an IDT electrode and the Q value.

FIG. 8 indicates that the Q value is high and the change in Q value is small when the thickness of the IDT electrode 5 is about 0.07λ or less. Therefore, the thickness of the IDT electrode 5 is preferably about 0.07λ or less, as described above.

Furthermore, the characteristics of the main mode were investigated by changing the angle between the S direction, which was the propagation direction of surface acoustic waves shown in FIG. 2, and the Z-axis direction in the crystal structure of the silicon carbide substrate 2 shown in FIG. 3. The design parameters were as described below. The angle between the S direction and the Z-axis direction was 0°, 12°, 16°, 20°, 24°, or 28°. The Z-axis is the same direction as the [001] direction in this description because of the symmetry of the crystal structure. In this description, the angle between the S direction and the Z-axis direction may thus be referred to as an angle between the S direction and the [001] direction.

Silicon carbide substrate 2; material . . . SiC with 3C—SiC cubic crystal structure, plane orientation . . . (100)

Low acoustic velocity film 3; material . . . SiO₂, thickness . . . 0.1λ

Lithium tantalate layer 4; material . . . 40° Y—LiTaO₃, thickness . . . 0.1λ

IDT electrode 5; material . . . Al, thickness . . . 0.14λ

Figure 9:
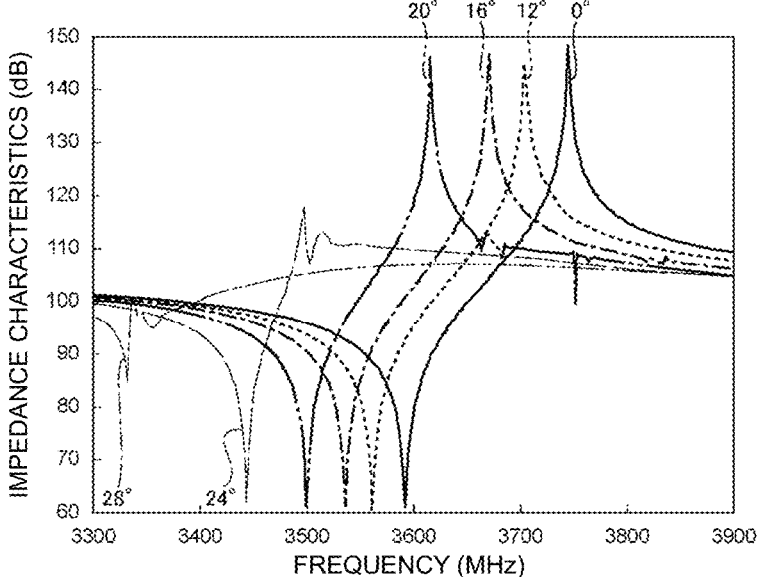
FIG. 9 is a figure illustrating the relationship between the characteristics of a main mode and the angle between the S direction, which is the propagation direction of surface acoustic waves, and the [001] direction in the crystal structure of the silicon carbide substrate.

FIG. 9 is a figure illustrating the relationship between the characteristics of the main mode and the angle between the S direction, which is the propagation direction of surface acoustic waves, and the [001] direction in the crystal structure of the silicon carbide substrate. FIG. 9 illustrates the cases where the angle is 0°, 12°, 16°, 20°, 24°, or 28°.

FIG. 9 indicates that the characteristics of the main mode are preferable when the angle between the S direction and the [001] direction is about 20° or less. When the main surface of the silicon carbide substrate 2 is the (100) plane, the angle between the S direction and the [001] direction is preferably about 20° or less.

It has been discovered that, when the main surface of the silicon carbide substrate 2 is the (110) plane, the relationship between the characteristics of the main mode and the angle between the S direction and the [001] direction has the same tendency as that described above. Therefore, the angle between the S direction and the [001] direction is also preferably about 20° or less when the main surface of the silicon carbide substrate 2 is the (110) plane.

Figure 10:
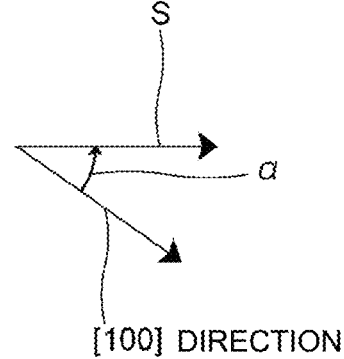
FIG. 10 is a schematic view for describing the angle $\alpha$.

FIG. 9 illustrates the cases where the angle between the S direction and the [001] direction varies. Here, the angle between the S direction and the [001] direction is 0°. In this case, the [100] direction in the crystal structure of the silicon carbide substrate 2 shown in FIG. 3 and the L direction in which the electrode fingers of the IDT electrode 5 shown in FIG. 2 extend is denoted by α. FIG. 10 illustrates an example of angle α. The Euler angles of the lithium tantalate layer 4 are denoted by ($\phi_{LT}$, $\theta_{LT}$, $\psi_{LT}$). The relationship between $\theta_{LT}$ in the Euler angles of the lithium tantalate layer 4, the angle α, and the spurious response caused by Rayleigh waves was determined.

Figure 11:
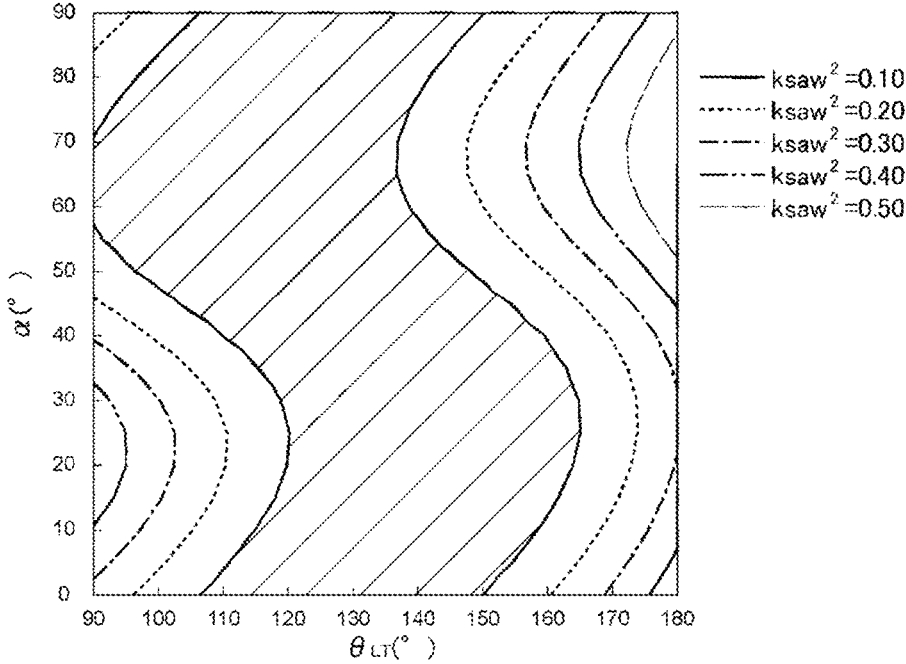
FIG. 11 is a figure illustrating the relationship between $\theta_{LT}$ in the Euler angles of a lithium tantalate layer, the angle $\alpha$, and the electromechanical coupling coefficient ksaw$^2$ of a spurious response caused by Rayleigh waves.

FIG. 11 is a figure illustrating the relationship between $\theta_{LT}$ in the Euler angles of the lithium tantalate layer, the angle α, and the electromechanical coupling coefficient ksaw² of spurious response caused by Rayleigh waves. In FIG. 11, the region where ksaw²≤0.10 is hatched.

FIG. 11 illustrates the relationship between angle α and $\theta_{LT}$ in the Euler angles of the lithium tantalate layer when the electromechanical coupling coefficients of spurious response caused by Rayleigh waves are 0.10, 0.20, 0.30, 0.40, and 0.50. The smaller electromechanical coupling coefficient ksaw² of the spurious response, the more preferred. The electromechanical coupling coefficient ksaw² of the spurious response is particularly preferably about 0.10 or less. The conditions under which ksaw²≤0.10 are represented by Formula 1 and Formula 2 below.

$$\theta_{LT} \leq \qquad\qquad\qquad\qquad\qquad\qquad \text{Formula 1}$$
$$-0.0000002385\alpha^5 + 0.0000526308\alpha^4 - 0.0035721517\alpha^3 +$$
$$0.0638600888\alpha^2 + 0.4558367918\alpha + 106.5910094271$$

$$\theta_{LT} \geq \qquad\qquad\qquad\qquad\qquad\qquad \text{Formula 2}$$
$$-0.0000001962\alpha^5 + 0.0000459691\alpha^4 - 0.0033813638\alpha^3 +$$
$$0.0717339858\alpha^2 + 0.2871014600\alpha + 150.5064489119$$

By satisfying Formula 1 and Formula 2, the electromechanical coupling coefficient ksaw² of the spurious response caused by Rayleigh waves can be controlled at about 0.10 or less (in the hatched region in FIG. 11), and spurious responses can be reduced or prevented effectively.

As shown in FIG. 9, as long as the angle between the S direction and the [001] direction is about 20° or less, the characteristics of the main mode are preferable as in the case where the angle is 0°. Therefore, when the angle between the S direction and the [001] direction is 0° or more and about 20° or less, and Formula 1 and Formula 2 are satisfied, spurious responses can be reduced or prevented effectively as in the case shown in FIG. 11.

As described above, the acoustic velocity $V_{Low}$ of a slow transversal wave of bulk waves propagating in the silicon carbide substrate 2 is preferably higher than the acoustic velocity $V_{SH}$ of acoustic waves propagating in the piezoelectric layer. The studies carried out by the inventors of the present invention reveal that the thickness of the IDT electrode 5 when $V_{Low}=V_{SH}$ differs depending on $\psi_{SiC}$ in the Euler angles of the silicon carbide substrate 2. The relationship between the $\psi_{SiC}$ and the thickness of the IDT electrode 5 when $V_{Low}=V_{SH}$ will be described below. The thickness of the IDT electrode is denoted by $T_{IDT}$.

Figure 12:
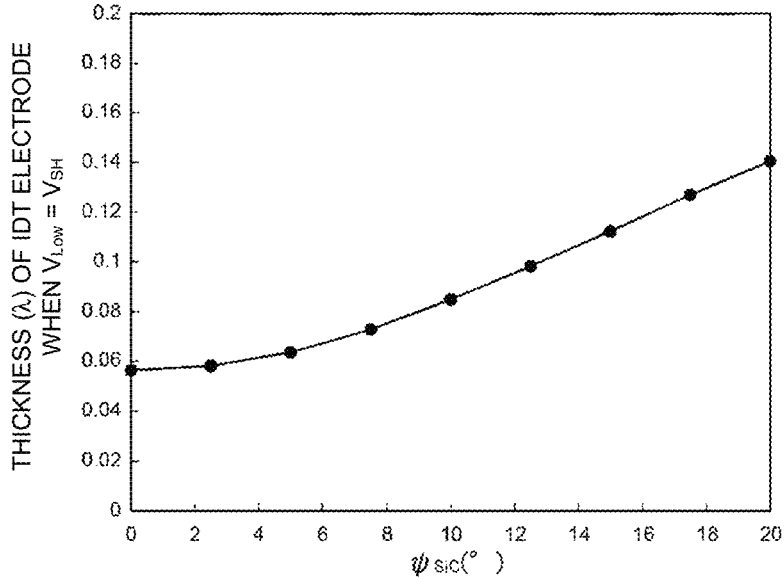
FIG. 12 is a figure illustrating the relationship between $\psi_{SiC}$ in the Euler angles of a silicon carbide substrate and the $T_{IDT}$ of an IDT electrode when $V_{LOW}=V_{SH}$.

FIG. 12 is a figure illustrating the relationship between $\psi_{SiC}$ in the Euler angles of the silicon carbide substrate and the thickness $T_{IDT}$ of the IDT electrode when $V_{Low}=V_{SH}$.

FIG. 12 indicates that the thickness $T_{IDT}$ of the IDT electrode 5 when $V_{Low}=V_{SH}$ decreases as $\psi_{SiC}$ in the Euler angles of the silicon carbide substrate approaches 0°. The conditions under which $V_{Low}>V_{SH}$ are represented by Formula 3 below. Formula 3 represents the relationship between $\psi_{SiC}$ and $T_{IDT}$ shown in FIG. 12.

$$T_{IDT} > -0.0000086722\,\psi_{SiC}^3 + \qquad\qquad \text{Formula 3}$$
$$0.0003976592\psi_{SiC2} - 0.000269711\Psi_{SiC} + 0.0566210388$$

By satisfying Formula 3, the acoustic velocity $V_{Low}$ of the slow transversal wave propagating in the silicon carbide substrate 2 can be made higher than the acoustic velocity $V_{SH}$ of the SH wave propagating in the silicon carbide substrate 2. This can more assuredly reduce or prevent higher-order mode.

Figure 13:
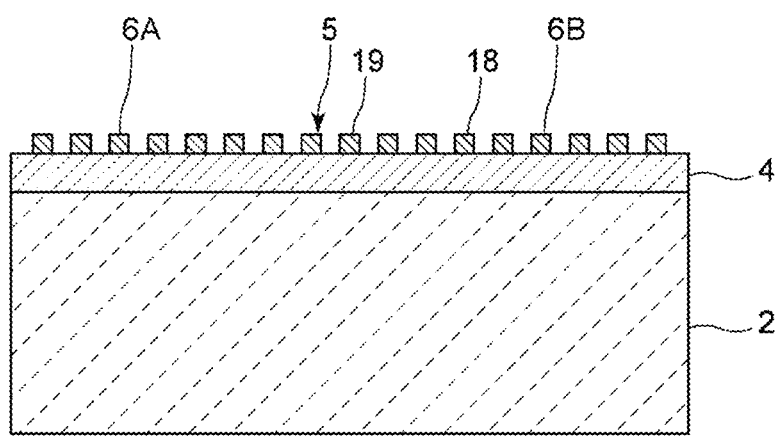
FIG. 13 is a front sectional view of an acoustic wave device according to a modification of the first preferred embodiment of the present invention.

FIG. 13 is a front sectional view of an acoustic wave device according to a modification of the first preferred embodiment.

In this modification, the lithium tantalate layer 4 is directly disposed on the silicon carbide substrate 2. In this case, the higher-order mode can be reduced or prevented similarly as in the first preferred embodiment. As in the first preferred embodiment shown in FIG. 1, the acoustic wave device 1 preferably includes the low acoustic velocity film 3 between the silicon carbide substrate 2 and the lithium tantalate layer 4. This configuration can suitably increase the fractional bandwidth. This effect will be described below.

The fractional bandwidth is represented by ($F_a-F_r$)/$F_r$, where $F_r$ is a resonant frequency, and $F_a$ is an anti-resonant frequency. The wavelength λ is the same at the resonant frequency and at the anti-resonant frequency. When the acoustic velocity at the resonant frequency is denoted by $V_r$, and the acoustic velocity at the anti-resonant frequency is denoted by $V_a$, ($F_a-F_r$)/$F_r$=($V_a-V_r$)/$V_r$. Thus, the fractional bandwidth can also be represented by ($V_r-V_a$)/$V_r$.

Examples of acoustic wave devices 1 having the configuration of the first preferred embodiment and different in the thickness of the low acoustic velocity film 3 were prepared. In addition, an acoustic wave device according to a modification of the first preferred embodiment that had no low acoustic velocity film 3, namely, in which the thickness of the low acoustic velocity film 3 was 0, was prepared. The fractional bandwidth of each of the acoustic wave devices was investigated. The design parameters of the acoustic wave devices were as described below.

Silicon carbide substrate 2; material . . . SiC with 3C—SiC cubic crystal structure Low acoustic velocity film 3; material . . . SiO₂, thickness . . . varied in 0.05λ increments in the range of 0 or more and 0.3λ or less Lithium tantalate layer 4; material . . . 35° Y—LiTaO₃, thickness . . . 0.15λ

IDT electrode 5; material . . . Al, thickness . . . 0.05λ

Wavelength λ of IDT electrode 5; 1 μm

Figure 14:
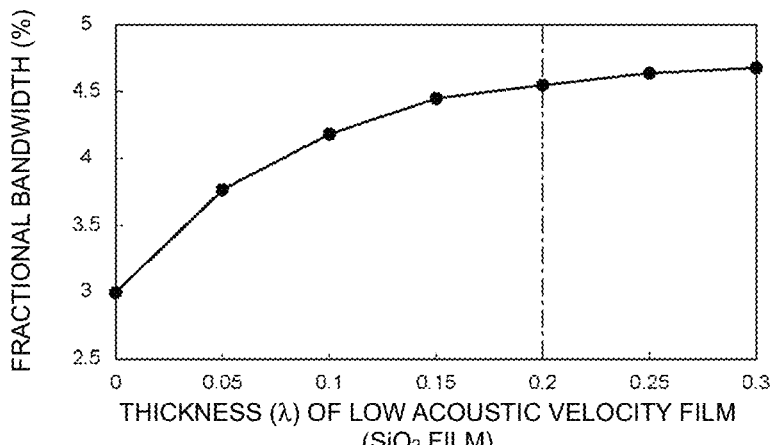
FIG. 14 is a figure illustrating the relationship between the thickness of a low acoustic velocity film and the fractional bandwidth.

FIG. 14 is a figure illustrating the relationship between the thickness of the low acoustic velocity film and the fractional bandwidth. FIG. 14 also illustrates the result of the acoustic wave device having no low acoustic velocity film 3.

FIG. 14 indicates that the fractional bandwidths of the acoustic wave devices that have the low acoustic velocity film 3 are larger than the fractional bandwidth of the acoustic wave device that has no low acoustic velocity film 3, namely, in which the thickness of the low acoustic velocity film 3 is 0. FIG. 14 also indicates that the fractional bandwidth increases with increasing thickness of the low acoustic velocity film 3. As shown in FIG. 14, variations in fractional bandwidth against variations in the thickness of the low acoustic velocity film 3 can be reduced when the thickness of the low acoustic velocity film 3 is about 0.2λ or more. Therefore, the thickness of the low acoustic velocity film 3 is preferably about 0.2λ or more.

Other suitable thicknesses of the low acoustic velocity film 3 will be described below. Acoustic wave devices having the same design parameters as those of the acoustic wave devices in FIG. 14 whose fractional bandwidths had been investigated were prepared. The phase of the higher-order mode generated at a frequency of about 1.5 times the frequency of the main mode and the phase of the higher-order mode generated at a frequency of about 2 times the frequency of the main mode in the acoustic wave devices were measured. In addition, the phase of the spurious Rayleigh mode in the acoustic wave devices was measured.

Figure 15:
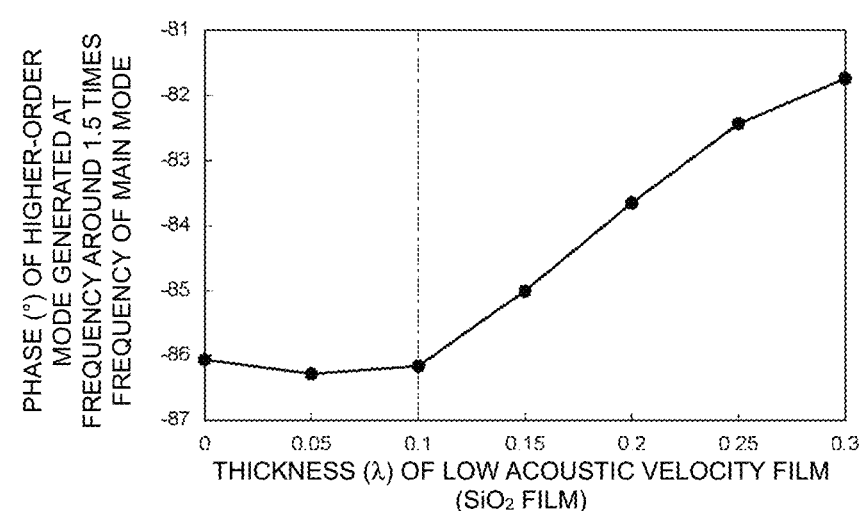
FIG. 15 is a figure illustrating the relationship between the thickness of the low acoustic velocity film and the phase of the higher-order mode generated at a frequency of about 1.5 times the frequency of the main mode.

FIG. 15 is a figure illustrating the relationship between the thickness of the low acoustic velocity film and the phase of the higher-order mode generated at a frequency of about 1.5 times the frequency of the main mode.

As shown in FIG. 15, the higher-order mode generated at a frequency of about 1.5 times the frequency of the main mode decreases as the thickness of the low acoustic velocity film 3 decreases. The thickness of the low acoustic velocity film 3 is preferably about 0.1λ or less. This configuration can further reduce or prevent the higher-order mode generated at a frequency of about 1.5 times the frequency of the main mode.

Figure 16:
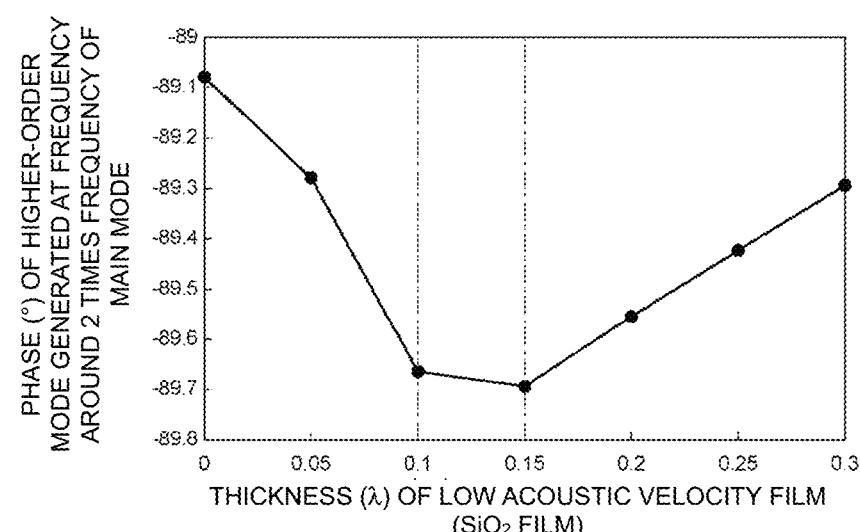
FIG. 16 is a figure illustrating the relationship between the thickness of the low acoustic velocity film and the phase of the higher-order mode generated at a frequency of about 2 times the frequency of the main mode.

FIG. 16 is a figure illustrating the relationship between the thickness of the low acoustic velocity film and the phase of the higher-order mode generated at a frequency of about 2 times the frequency of the main mode.

As shown in FIG. 16, the phase of the higher-order mode generated at a frequency of about 2 times the frequency of the main mode reaches the minimum when the thickness of the low acoustic velocity film 3 is about 0.1λ to about 0.15λ. FIG. 16 indicates that the higher-order mode decreases as the thickness of the low acoustic velocity film 3 approaches about 0.1λ to about 0.15λ. The thickness of the low acoustic velocity film 3 is preferably about 0.1λ or more and about 0.15λ or less. This configuration can further reduce or prevent the higher-order mode generated at a frequency of about 2 times the frequency of the main mode.

Figure 17:
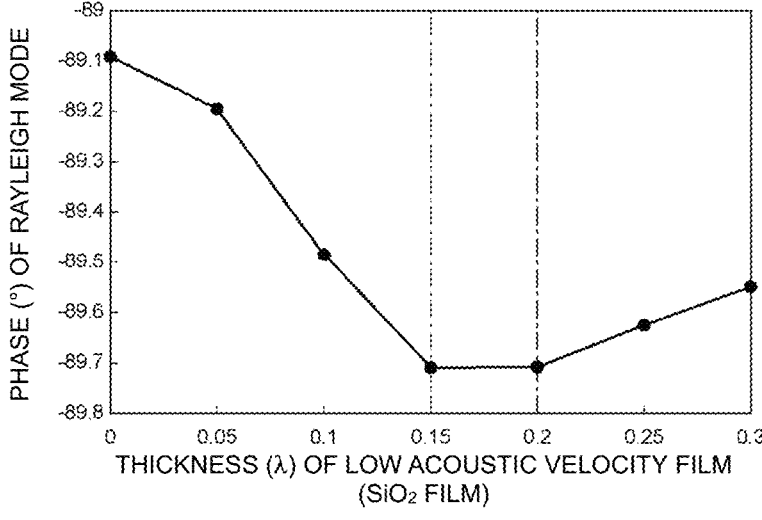
FIG. 17 is a figure illustrating the relationship between the thickness of the low acoustic velocity film and the phase of the Rayleigh mode.

FIG. 17 is a figure illustrating the relationship between the thickness of the low acoustic velocity film and the phase of the Rayleigh mode.

As shown in FIG. 17, the phase of the spurious Rayleigh mode reaches the minimum when the thickness of the low acoustic velocity film 3 is about 0.15λ to about 0.2λ. FIG. 17 indicates that the Rayleigh mode decreases as the thickness of the low acoustic velocity film 3 approaches about 0.15λ to about 0.2λ. The thickness of the low acoustic velocity film 3 is preferably about 0.15λ or more and about 0.2λ or less. This can further reduce or prevent Rayleigh mode.

In the first preferred embodiment, the piezoelectric layer is a lithium tantalate layer. The piezoelectric layer may be a lithium niobate layer. A preferred embodiment in which the piezoelectric layer is a lithium niobate layer will be described below.

Figure 18:
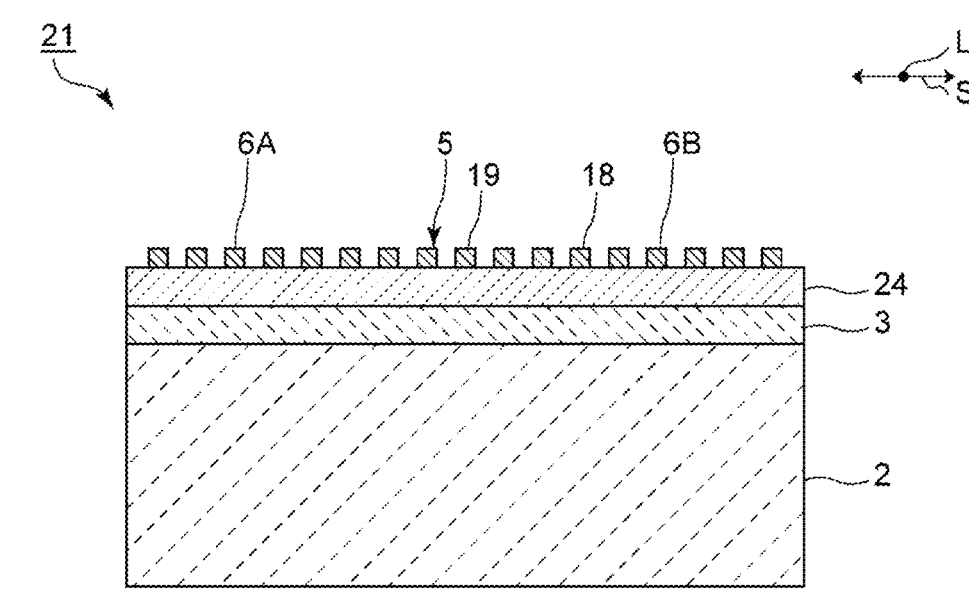
FIG. 18 is a front sectional view of an acoustic wave device according to a second preferred embodiment of the present invention.

FIG. 18 is a front sectional view of an acoustic wave device according to a second preferred embodiment of the present invention.

This preferred embodiment differs from the first preferred embodiment in that the piezoelectric layer is a lithium niobate layer 24. Except for this point, the acoustic wave device 21 of this preferred embodiment has the same configuration as that of the acoustic wave device 1 of the first preferred embodiment. Since the configuration of the electrode, the configuration of the silicon carbide substrate 2, and other configurations in this preferred embodiment are the same as those in the first preferred embodiment, FIG. 2, FIG. 3, and other figures may be used as references.

In this preferred embodiment, the relationship of $V_{Low} > V_{SHa}$ is established. It is noted that the relationship of $V_{Low} > V_{SHa}$ is not necessarily satisfied. The relationship of $V_{Low} > V_{SH}$ may be established at a frequency other than the anti-resonant frequency.

The acoustic velocity of bulk waves propagating in the low acoustic velocity film 3 shown in FIG. 18 is lower than the acoustic velocity of bulk waves propagating in the lithium niobate layer 24 defining and functioning as a piezoelectric layer. The low acoustic velocity film 3 in this preferred embodiment is a silicon oxide film. More specifically, silicon oxide constituting the low acoustic velocity film 3 in this preferred embodiment is SiO₂. The material of the low acoustic velocity film 3 is not limited to the above material and may be, for example, glass, silicon oxynitride, niobium oxide, or a material containing, as a main component, a compound produced by adding fluorine, carbon, or boron to silicon oxide.

In the acoustic wave device 21, the lithium niobate layer 24 is indirectly stacked on the silicon carbide substrate 2 with the low acoustic velocity film 3 therebetween. The lithium niobate layer 24 may be directly stacked on the silicon carbide substrate 2.

Unique characteristics of this preferred embodiment include the lithium niobate layer 24 and the silicon carbide substrate 2 including a 3C—SiC cubic crystal structure being stacked on top of each other, and the acoustic wave device 21 using an SH mode. This configuration can reduce or prevent higher-order mode in the acoustic wave device 21 including the silicon carbide substrate 2. The details will be described below.

The acoustic wave device 21 having the configuration of the second preferred embodiment and the following design parameters was prepared. The Euler angles of the lithium niobate layer 24 are denoted by ($\phi_{LN}$, $\theta_{LN}$, $\psi_{LN}$).

Silicon carbide substrate 2; material . . . SiC with 3C—SiC cubic crystal structure, plane orientation . . . (100), thickness . . . 1 μm Low acoustic velocity film 3; material . . . SiO₂, thickness . . . 0.1λ

Lithium niobate layer 24; $\theta_{LN}$ in Euler angles . . . 135°, thickness . . . 0.1λ

IDT electrode 5; material . . . Al, thickness . . . 0.07λ

In Comparative Example 2, an acoustic wave device including a silicon carbide substrate made of silicon carbide with a 4H—SiC hexagonal structure was prepared. The design parameters of Comparative Example 2 were the same as those of the acoustic wave device 21 except for the silicon carbide substrate. The intensity of the higher-order mode generated at about 1.5 times the frequency of the main mode was compared between the acoustic wave device 21 having the configuration of the second preferred embodiment and Comparative Example 2. The frequency of about 1.5 times the frequency of the main mode in the second preferred embodiment and Comparative Example 2 is a frequency of about 6 GHz.

Figure 19:
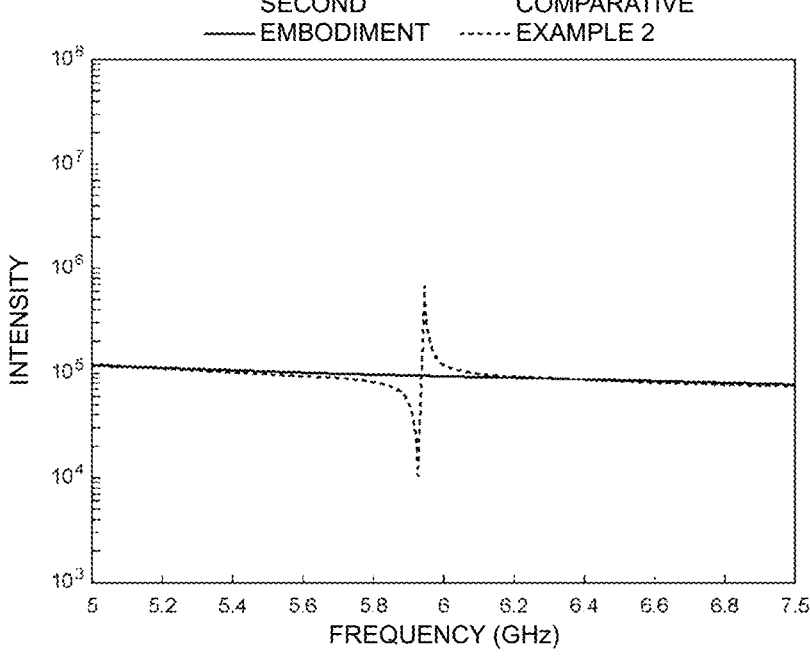
FIG. 19 is a figure illustrating the intensity of the higher-order mode generated at about 1.5 times the frequency of the main mode in the second preferred embodiment and Comparative Example 2 of the present invention.

FIG. 19 is a figure illustrating the intensity of the higher-order mode generated at about 1.5 times the frequency of the main mode in the second preferred embodiment and Comparative Example 2.

As shown in FIG. 19, a large higher-order mode is generated at about 1.5 times the frequency of the main mode in Comparative Example 2. In the second preferred embodiment, almost no higher-order mode is generated at about 1.5 times the frequency of the main mode. In the second preferred embodiment, the higher-order mode can thus be reduced or prevented.

As in the second preferred embodiment, the acoustic velocity of the higher-order mode propagating in the piezoelectric layer is preferably higher than the acoustic velocity of a slow transversal wave of bulk waves propagating in the silicon carbide substrate 2. This causes the higher-order mode to leak to the silicon carbide substrate 2 and can more assuredly reduce or prevent higher-order mode.

The electromechanical coupling coefficient of an SH wave excited in the acoustic wave device 21 depends on $\theta_{LN}$ in the Euler angles of the lithium niobate layer 24. The range of $\theta_{LN}$ suitable for using an SH wave as a main mode will be described below.

Figure 20:
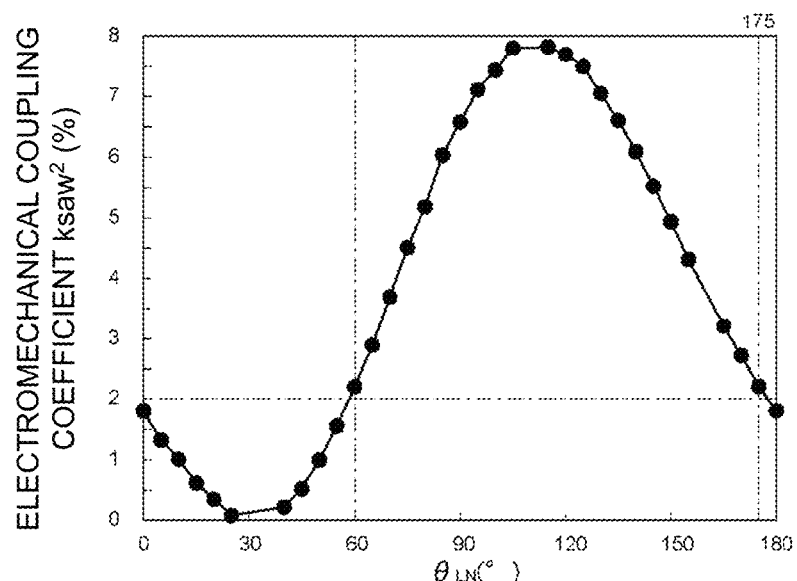
FIG. 20 is a figure illustrating the relationship between $\theta_{LN}$ in the Euler angles of a lithium niobate layer and the electromechanical coupling coefficient of an SH wave.

FIG. 20 is a figure illustrating the relationship between $\theta_{LN}$ in the Euler angles of the lithium niobate layer and the electromechanical coupling coefficient of the SH wave.

The electromechanical coupling coefficient of the SH wave used as a main mode is preferably about 2% based on practical use of the acoustic wave device. As shown in FIG. 20, the electromechanical coupling coefficient of the SH wave is about 2% or more when $\theta_{LN}$ in the Euler angles of the lithium niobate layer is about 600 or more and about 1750 or less. Therefore, the $\theta_{LN}$ is preferably about 600 or more and about 1750 or less. In this case, the SH wave can be preferably used as a main mode.

The range of $\theta_{LN}$ in the Euler angles of the lithium niobate layer, in which the higher-order mode generated at a frequency of about 3 times the frequency of the main mode can be reduced or prevented, will be described below.

Figure 21:
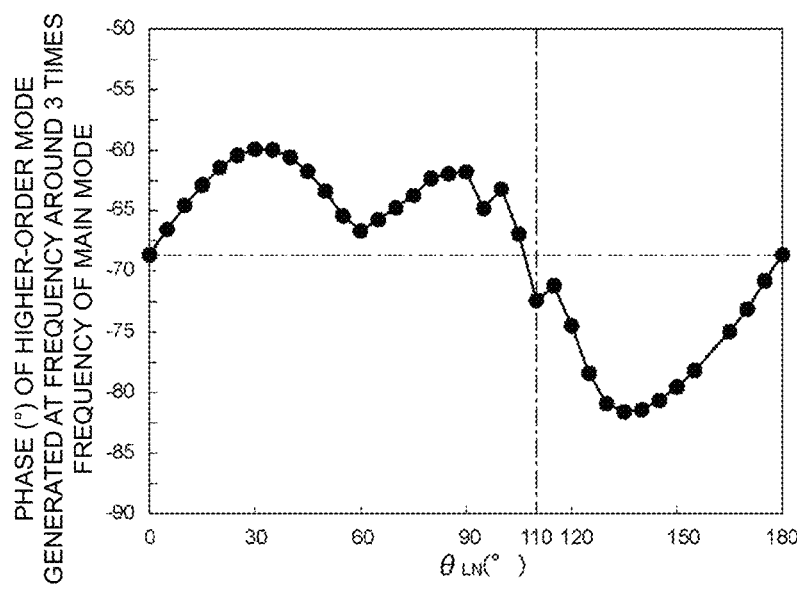
FIG. 21 is a figure illustrating the relationship between $\theta_{LN}$ in the Euler angles of the lithium niobate layer and the phase of a spurious response of the higher-order mode generated at a frequency of about 3 times the frequency of the main mode.

FIG. 21 is a figure illustrating the relationship between $\theta_{LN}$ in the Euler angles of the lithium niobate layer and the phase of spurious response of the higher-order mode generated at a frequency of about 3 times the frequency of the main mode.

As shown in FIG. 21, the higher-order mode generated at a frequency of about 3 times the frequency of the main mode can be effectively reduced or prevented when $\theta_{LN}$ in the Euler angles of the lithium niobate layer is about 1100 or more and about 1800 or less. The $\theta_{LN}$ is preferably about 1100 or more and about 1800 or less.

As in the first preferred embodiment, the Rayleigh waves as well as the higher-order mode described above can also be spurious in the acoustic wave device 21 using the SH mode as a main mode. The range of $\theta_{LN}$ in the Euler angles of the lithium niobate layer, in which spurious response caused by Rayleigh waves can be reduced or prevented, will be described below.

Figure 22:
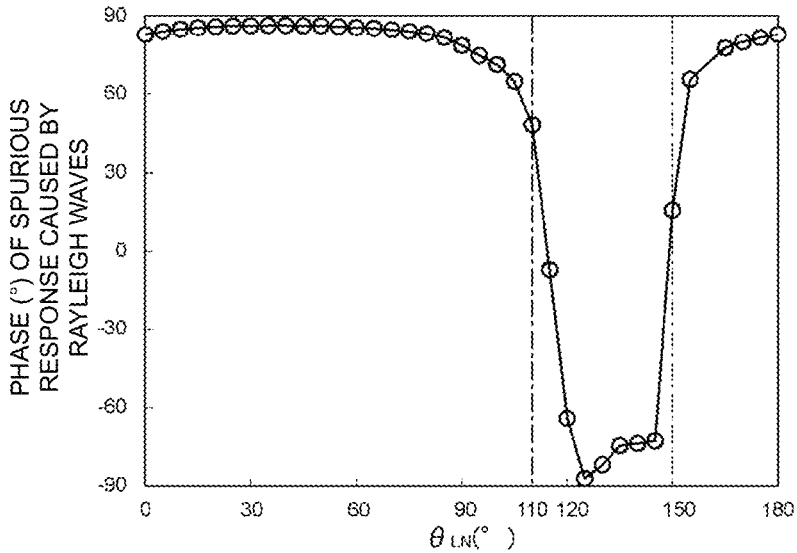
FIG. 22 is a figure illustrating the relationship between $\theta_{LN}$ in the Euler angles of the lithium niobate layer and the phase of a spurious response caused by Rayleigh waves.

FIG. 22 is a figure illustrating the relationship between $\theta_{LN}$ in the Euler angles of the lithium niobate layer and the phase of spurious response caused by Rayleigh waves.

As shown in FIG. 22, the spurious response caused by Rayleigh waves can be effectively reduced or prevented when $\theta_{LN}$ in the Euler angles of the lithium niobate layer is about 110° or more and about 150° or less. Therefore, the $\theta_{LN}$ is preferably about 110° or more and about 150° or less.

The characteristics of the main mode were investigated by changing the angle between the S direction, which was the propagation direction of surface acoustic waves shown in FIG. 2, and the Z-axis direction in the crystal structure of the silicon carbide substrate 2 shown in FIG. 3. The design parameters were as described below. The angle between the S direction and the Z-axis direction was 0°, 12°, 16°, 20°, 24°, or 28°. As described above, the Z-axis is the same direction as the [001] direction in this description because of the symmetry of the crystal structure. In this description, the angle between the S direction and the Z-axis direction may thus be referred to as an angle between the S direction and the [001] direction.

Silicon carbide substrate 2; material . . . SiC with 3C—SiC cubic crystal structure, plane orientation . . . (100)

Low acoustic velocity film 3; material . . . SiO₂, thickness . . . 0.1λ

Lithium niobate layer 24; material . . . 45° Y—LiNbO₃, thickness . . . 0.1λ

IDT electrode 5; material . . . Al, thickness . . . 0.14λ

Figure 23:
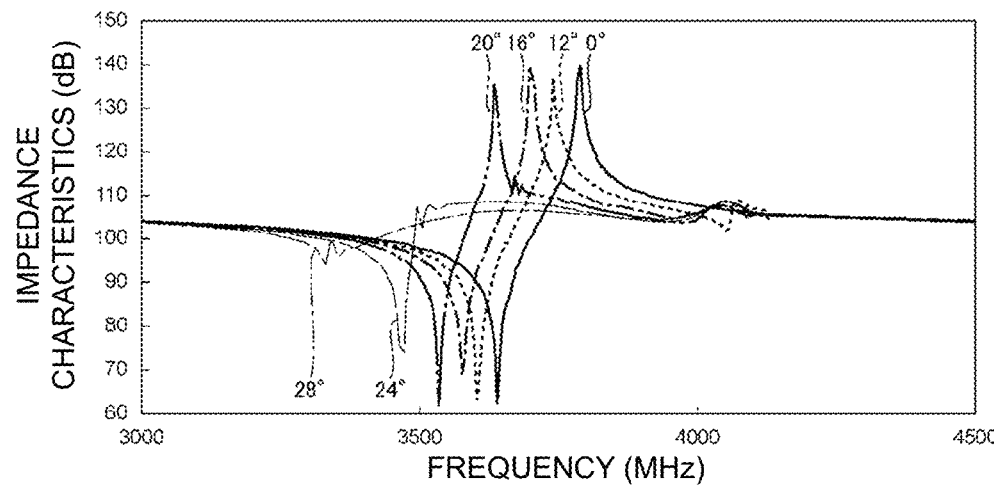
FIG. 23 is a figure illustrating the relationship between the characteristics of the main mode and the angle between the S direction, which is the propagation direction of surface acoustic waves, and the [001] direction in the crystal structure of the silicon carbide substrate.

FIG. 23 is a figure illustrating the relationship between characteristics of the main mode and the angle between the S direction, which is the propagation direction of surface acoustic waves, and the [001] direction in the crystal structure of the silicon carbide substrate. FIG. 23 illustrates the cases where the angle is 0°, 12°, 16°, 20°, 24°, or 28°.

FIG. 23 indicates that the characteristics of the main mode are preferable when the angle between the S direction and the [001] direction is about 20° or less. When the main surface of the silicon carbide substrate 2 is the (100) plane, the angle between the S direction and the [001] direction is preferably about 20° or less.

It has been discovered that, when the main surface of the silicon carbide substrate 2 is the (110) plane, the relationship between the characteristics of the main mode and the angle between the S direction and the [001] direction has the same tendency as that described above. Therefore, the angle between the S direction and the [001] direction is also preferably about 20° or less when the main surface of the silicon carbide substrate 2 is the (110) plane.

Figure 24:
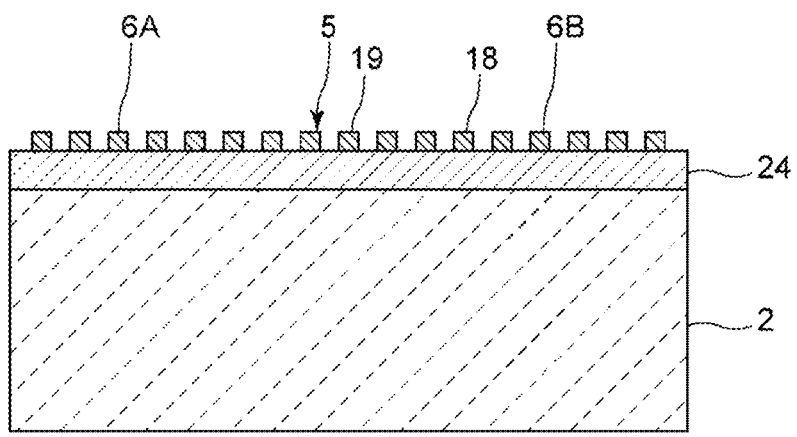
FIG. 24 is a front sectional view of an acoustic wave device according to a modification of the second preferred embodiment of the present invention.

FIG. 24 is a front sectional view of an acoustic wave device according to a modification of the second preferred embodiment.

In this modification, the lithium niobate layer 24 is directly disposed on the silicon carbide substrate 2. In this case, the higher-order mode can be reduced or prevented similarly as in the second preferred embodiment. As in the second preferred embodiment shown in FIG. 18, the acoustic wave device 21 preferably includes the low acoustic velocity film 3 between the silicon carbide substrate 2 and the lithium niobate layer 24. This configuration can suitably increase the fractional bandwidth. This effect will be described below.

Examples of acoustic wave devices 21 having the configuration of the second preferred embodiment and different in the thickness of the low acoustic velocity film 3 were prepared. In addition, an acoustic wave device according to a modification of the second preferred embodiment that had no low acoustic velocity film 3, namely, in which the thickness of the low acoustic velocity film 3 was 0, was prepared. The fractional bandwidth of each of the acoustic wave devices was investigated. The design parameters of the acoustic wave devices were as described below.

Silicon carbide substrate 2; material . . . SiC with 3C—SiC cubic crystal structure, Euler angles (0°, 0°, 0°)

Low acoustic velocity film 3; material . . . SiO$_2$, thickness . . . varied in 0.05λ increments in the range of 0 or more and 0.2λ or less Lithium niobate layer 24; material . . . 135° Y—LiNbO$_3$, thickness . . . 0.1λ

IDT electrode 5; material . . . Al, thickness . . . 0.07λ

Wavelength λ of IDT electrode 5; 1 μm

Figure 25:
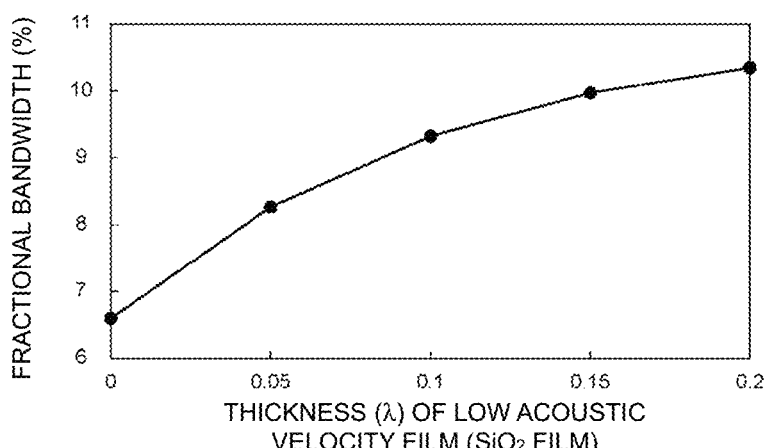
FIG. 25 is a figure illustrating the relationship between the thickness of a low acoustic velocity film and the fractional bandwidth.

FIG. 25 is a figure illustrating the relationship between the thickness of the low acoustic velocity film and the fractional bandwidth. FIG. 25 also illustrates the result of the acoustic wave device having no low acoustic velocity film 3.

FIG. 25 indicates that the fractional bandwidths of the acoustic wave devices that have the low acoustic velocity film 3 are larger than the fractional bandwidth of the acoustic wave device that has no low acoustic velocity film 3, namely, in which the thickness of the low acoustic velocity film 3 is 0. FIG. 25 also indicates that the fractional bandwidth increases with increasing thickness of the low acoustic velocity film 3.

A suitable thickness of the low acoustic velocity film 3 will be described below. Acoustic wave devices having the same design parameters as those of the acoustic wave devices in FIG. 25 whose fractional bandwidths had been investigated were prepared. The phase of the higher-order mode generated at a frequency of about 2 times the frequency of the main mode in the acoustic wave devices was measured.

Figure 26:
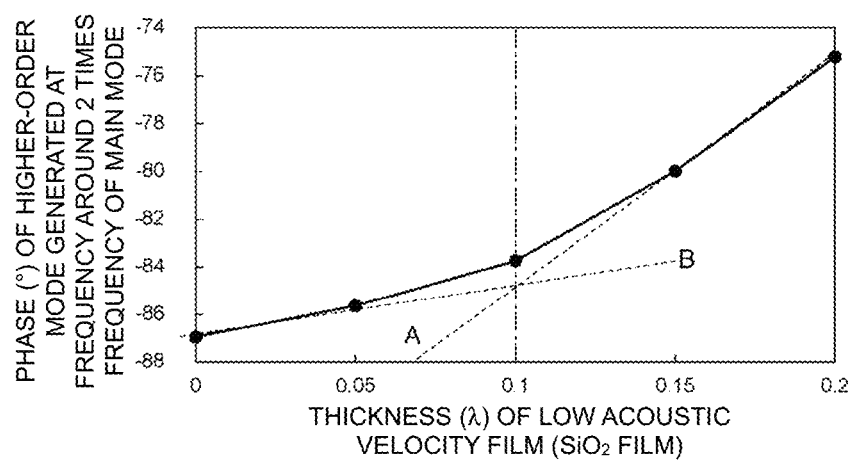
FIG. 26 is a figure illustrating the relationship between the thickness of the low acoustic velocity film and the phase of the higher-order mode generated at a frequency of about 2 times the frequency of the main mode.

FIG. 26 is a figure illustrating the relationship between the thickness of the low acoustic velocity film and the phase of the higher-order mode generated at a frequency of about 2 times the frequency of the main mode.

As shown in FIG. 26, the higher-order mode generated at a frequency of about 2 times the frequency of the main mode decreases as the thickness of the low acoustic velocity film 3 decreases. The broken line A and the broken line B in FIG. 26 indicate the slope of changes in the phase of the higher-order mode against the thickness of the low acoustic velocity film 3. As indicated by the broken line A and the broken line B, the slope of changes in the phase of the higher-order mode when the thickness of the low acoustic velocity film 3 is about 0.1λ or less is smaller than the slope of changes in the phase of the higher-order mode when the thickness is more than about 0.1λ. The thickness of the low acoustic velocity film 3 is preferably about 0.1λ or less. In this case, the higher-order mode generated at a frequency of about 2 times the frequency of the main mode can be reduced or prevented stably and effectively.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate;
a piezoelectric layer on the support substrate; and an IDT electrode on the piezoelectric layer and including a plurality of electrode fingers; wherein
the support substrate is a silicon carbide substrate including a 3C—SiC cubic crystal structure;
the piezoelectric layer is a lithium tantalate layer or a lithium niobate layer;
the acoustic wave device uses an SH wave as a main mode;
a main surface of the silicon carbide substrate is a (100) plane; and
an angle between a propagation direction of surface acoustic waves propagating in the piezoelectric layer on the silicon carbide substrate and a [001] direction in a crystal structure of the silicon carbide substrate is about 20° or less.

2. The acoustic wave device according to claim 1, wherein the piezoelectric layer is a lithium tantalate layer.

3. The acoustic wave device according to claim 2, wherein the IDT electrode has a thickness of about 0.07λ or less.

4. The acoustic wave device according to claim 1, further comprising:
a low acoustic velocity film between the silicon carbide substrate and the lithium tantalate layer; wherein
an acoustic velocity of bulk waves propagating in the low acoustic velocity film is lower than an acoustic velocity of bulk waves propagating in the lithium tantalate layer.

5. The acoustic wave device according to claim 4, wherein the low acoustic velocity film has a thickness of about 0.1λ or more and about 0.15λ or less.

6. The acoustic wave device according to claim 4, wherein the low acoustic velocity film has a thickness of about 0.15λ or more and about 0.2λ or less.

7. The acoustic wave device according to claim 4, wherein the low acoustic velocity film has a thickness of about 0.2λ or more.

8. The acoustic wave device according to claim 1, wherein the piezoelectric layer is a lithium niobate layer.

9. The acoustic wave device according to claim 8, wherein, when Euler angles of the lithium niobate layer are denoted by ($\phi_{LN}$, $\theta_{LN}$, $\psi_{LN}$), about 60°≤$\theta_{LN}$≤about 175°.

10. The acoustic wave device according to claim 8, wherein, when Euler angles of the lithium niobate layer are denoted by ($\phi_{LN}$, $\theta_{LN}$, $\psi_{LN}$), about 110°≤$\theta_{LN}$≤about 180°.

11. The acoustic wave device according to claim 9, wherein about 110°≤$\theta_{LN}$≤about 150°.

12. The acoustic wave device according to claim 8, further comprising:
a low acoustic velocity film between the silicon carbide substrate and the lithium niobate layer;
an acoustic velocity of bulk waves propagating in the low acoustic velocity film is lower than an acoustic velocity of bulk waves propagating in the lithium niobate layer.

13. The acoustic wave device according to claim 4, wherein the low acoustic velocity film has a thickness of about 0.1λ or less.

14. The acoustic wave device according to claim 1, wherein an acoustic velocity of a slow transversal wave of bulk waves propagating in the silicon carbide substrate is higher than an acoustic velocity of an SH wave propagating in the piezoelectric layer.

15. An acoustic wave device comprising:
a support substrate;
a piezoelectric layer on the support substrate; and
an IDT electrode on the piezoelectric layer and including a plurality of electrode fingers; wherein
the support substrate is a silicon carbide substrate including a 3C—SiC cubic crystal structure;

the piezoelectric layer is a lithium tantalate layer;

the acoustic wave device uses an SH wave as a main mode;

an angle between a propagation direction of surface acoustic waves and a [001] direction in a crystal structure of the silicon carbide substrate is about 0° or more and about 20° or less; and when an angle between the [100] direction in the crystal structure of the silicon carbide substrate and a direction in which the electrode fingers of the IDT electrode extend is denoted by $\alpha$, and Euler angles of the lithium tantalate layer are denoted by $(\phi_{LT}, \theta_{LT}, \psi LT)$, Formula 1 and Formula 2 are satisfied:

$$\theta_{LT} \leq \qquad \text{Formula 1}$$

$$-0.0000002385\alpha^5 + 0.0000526308\alpha^4 - 0.0035721517\alpha^3 +$$
$$0.0638600888\alpha^2 + 0.4558367918\alpha + 106.5910094271;$$

and $$\theta_{LT} \geq \qquad \text{Formula 2}$$

$$-0.0000001962\alpha^5 + 0.0000459691\alpha^4 - 0.0033813638\alpha^3 +$$
$$0.0717339858\alpha^2 + 0.2871014600\alpha + 150.5064489119.$$

16. An acoustic wave device comprising:

a support substrate;

a piezoelectric layer on the support substrate; and an IDT electrode on the piezoelectric layer and including a plurality of electrode fingers; wherein the support substrate is a silicon carbide substrate including a 3C—SiC cubic crystal structure;

the piezoelectric layer is a lithium tantalate layer;

the acoustic wave device uses an SH wave as a main mode; and when Euler angles of the silicon carbide substrate are denoted by $(\phi_{SiC}, \theta_{SiC}, \psi_{SiC})$, and a thickness of the IDT electrode is denoted by $T_{IDT}$, Formula 3 is satisfied:

$$T_{IDT} > -0.0000086722\psi_{SiC}^3 + \qquad \text{Formula 3}$$
$$0.0003976592\psi_{SiC}^2 - 0.000269711\Psi_{SiC} + 0.0566210388.$$

17. An acoustic wave device comprising:

a support substrate;

a piezoelectric layer on the support substrate; and an IDT electrode on the piezoelectric layer and including a plurality of electrode fingers; wherein the support substrate is a silicon carbide substrate including a 3C—SiC cubic crystal structure;

the piezoelectric layer is a lithium tantalate layer or a lithium niobate layer;

the acoustic wave device uses an SH wave as a main mode;

a main surface of the silicon carbide substrate is a (110) plane; and an angle between a propagation direction of surface acoustic waves propagating in the piezoelectric layer on the silicon carbide substrate and a [001] direction in a crystal structure of the silicon carbide substrate is about 20° or less.

* * * * *